United States Patent
Bahadur et al.

(10) Patent No.: US 10,168,113 B2
(45) Date of Patent: Jan. 1, 2019

(54) HEAT PIPES WITH ELECTRICAL PUMPING OF CONDENSATE

(71) Applicant: Board of Regents, The University of Texas System, Austin, TX (US)

(72) Inventors: Vaibhav Bahadur, Austin, TX (US); Renee Hale, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 117 days.

(21) Appl. No.: 15/124,267

(22) PCT Filed: Mar. 12, 2015

(86) PCT No.: PCT/US2015/020109
§ 371 (c)(1),
(2) Date: Sep. 7, 2016

(87) PCT Pub. No.: WO2015/142607
PCT Pub. Date: Sep. 24, 2015

(65) Prior Publication Data
US 2017/0074603 A1 Mar. 16, 2017

Related U.S. Application Data

(60) Provisional application No. 61/968,744, filed on Mar. 21, 2014, provisional application No. 62/002,241, filed on May 23, 2014.

(51) Int. Cl.
*B29C 47/88* (2006.01)
*F28F 13/16* (2006.01)
(Continued)

(52) U.S. Cl.
CPC ............ *F28F 13/16* (2013.01); *F28D 15/025* (2013.01); *F28D 15/0266* (2013.01);
(Continued)

(58) Field of Classification Search
CPC ...... F28D 15/00; F28D 15/027; F28D 15/025; F28F 13/16
See application file for complete search history.

(56) References Cited

U.S. PATENT DOCUMENTS 5,699,668 A 12/1997 Cox
7,204,298 B2 4/2007 Hodes et al.
(Continued)

OTHER PUBLICATIONS

Publication entitled "An energy-based model for electrowetting-induced droplet actuation" by Bahadur, 2006.*
(Continued)

*Primary Examiner* — Len Tran
*Assistant Examiner* — Paul Alvare
(74) *Attorney, Agent, or Firm* — Robert A. Voigt, Jr.; Winstead, P.C.

(57) ABSTRACT

A heat pipe with electrical pumping. The heat pipe includes a condenser to condense vapor into liquid droplets and an evaporator for the liquid-vapor conversion. Furthermore, the heat pipe includes liquid conduits for carrying the liquid droplets, where every liquid conduit includes electrodes for moving the liquid droplets along the liquid conduits. Additionally, the heat pipe includes vapor conduits for carrying the vapor. After the liquid is condensed and droplets are formed, they are electrically pumped towards the evaporator by sequentially actuating a series of electrodes in the liquid conduits. By implementing electrical pumping instead of wick-based pumping, the heat transport capacity over long distances is greatly increased. Additionally, since the electrical force is greater than gravity, it is possible to develop orientation independent long heat pipes. Other benefits include planar form factors, noiselessness, high reliability due to the absence of moving mechanical parts and ultralow power consumption.

10 Claims, 5 Drawing Sheets

(51) Int. Cl.
*H05K 7/20* (2006.01)
*F28D 15/02* (2006.01)

(52) U.S. Cl.
CPC ...... *H05K 7/20336* (2013.01); *F28F 2245/04* (2013.01); *F28F 2260/00* (2013.01)

(56) References Cited

U.S. PATENT DOCUMENTS

| | | | |
|---|---|---|---|
| 8,493,736 B2* | 7/2013 | Oprins | H01L 23/4735 165/104.23 |
| 2004/0058450 A1* | 3/2004 | Pamula | B01F 13/0071 436/150 |
| 2008/0047701 A1 | 2/2008 | Bahadar et al. | |
| 2009/0008064 A1 | 1/2009 | Nicole et al. | |

OTHER PUBLICATIONS

Written Opinion for International Application No. PCT/US15/20109 dated Jun. 16, 2015, pp. 1-4.
Cheng et al., "Spot Cooling Using Electrowetting-Controlled Thin Film Heat Transfer," ASME 2012 Third International Conference on Micro/Nanoscale Heat and Mass Transfer, Atlanta, Georgia, Mar. 3-6, 2012, pp. 275-281.
Migliaccio et al., "Evaporative Heat Transfer from an Electrowetted Liquid Ribbon on a Heated Substrate," CTRC Research Publications, paper 181, 2013, pp. 1-31.
International Preliminary Report on Patentability for International Application No. PCT/US2015/020109 dated Sep. 21, 2016, pp. 1-6.

\* cited by examiner

HEAT PIPES WITH ELECTRICAL PUMPING OF CONDENSATE

CROSS REFERENCE TO RELATED APPLICATIONS

This application claims priority to U.S. Provisional Patent Application Ser. No. 62/002,241, "Heat Pipes with Active Electrical Pumping," filed May 23, 2014 as well as claims priority to U.S. Provisional Patent Application Ser. No. 61/968,744, "Electrical Pumping-Based Active Heat Pipes," filed Mar. 21, 2014, which are both incorporated by reference herein in their entirety.

TECHNICAL FIELD

The present invention relates generally to heat pipes, and more particularly to heat pipes with electrical pumping thereby allowing higher capacity, longer and thin, planar form factor heat pipes to be developed.

BACKGROUND

Heat pipes are heat transfer devices to move heat from a hot source (referred to as an "evaporator") to a cold sink (referred to as a "condenser"). FIG. 1 illustrates the cross section of a conventional heat pipe 100. Referring to FIG. 1, heat flow occurs via evaporation of the heat pipe working fluid at the evaporator end 101; the heat absorbed is used to convert liquid into vapor (see arrows near evaporator end 101). This hot vapor flows through the pipe center (see arrows in middle of heat pipe 100) and condenses at the condenser (cold) end 102 where it rejects the heat (see arrows near condenser end 102). A wick structure 103 lining the inside of heat pipe 100 pulls the condensed liquid back to evaporator 101 (see arrows in wick structure 103 directed to evaporator 101) to complete the closed cycle. Heat pipe 100 utilizes capillary action in an internal wick structure 103 to drive liquid circulation. As a result, the length of conventional heat pipes is limited by the capillary pressure generated in the heat pipe wick beyond which the wick cannot provide sufficient liquid to the evaporator. Consequently, conventional heat pipes cannot transport heat over very long distances (at high enough heat flow rates) since the wick pressure is not sufficient to pump liquid condensate back to the evaporator. Furthermore, conventional heat pipe architectures do not easily lend themselves to very thin and slender shapes which may expand the potential applications of heat pipes.

BRIEF SUMMARY

In one embodiment of the present invention, a heat pipe comprises a condenser region configured to condense vapor and split the liquid into liquid droplets. The heat pipe further comprises a plurality of liquid conduits for carrying the liquid droplets, where each of the plurality of liquid conduits comprises a first plurality of underlying electrodes. The heat pipe additionally comprises a plurality of vapor conduits for carrying the vapor. In addition, the heat pipe comprises an evaporator region connected to the condenser region via the plurality of liquid conduits and vapor conduits, where the evaporator region is configured to convert the liquid droplets into the vapor. The liquid droplets condensed by the condenser region are electrically pumped towards the evaporator region by sequentially actuating a series of the first plurality of underlying electrodes.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which.

DETAILED DESCRIPTION

As stated in the Background section, heat pipes are heat transfer devices to move heat from a hot source (referred to as an "evaporator") to a cold sink (referred to as a "condenser"). In conventional heat pipes, heat flow occurs via evaporation of the heat pipe working fluid at the evaporator end; the heat absorbed is used to convert liquid into vapor. This hot vapor flows through the pipe center and condenses at the condenser (cold) end where it rejects the heat. A wick structure lining the inside of the heat pipe pulls the condensed liquid back to the evaporator to complete the closed cycle. Conventional heat pipes utilize capillary action in an internal wick structure to drive liquid circulation. As a result, the length of conventional heat pipes is limited by the capillary pressure generated in the wick, beyond which the wick structure cannot provide liquid to the evaporator. That is, conventional heat pipes cannot transport heat over very long distances (at high enough heat flow rates) since the wick pressure is not sufficient to pump liquid condensate back to the evaporator. Furthermore, conventional heat pipe architectures do not easily lend themselves to very thin and slender shapes which may expand the potential applications of heat pipes.

Figure 2:
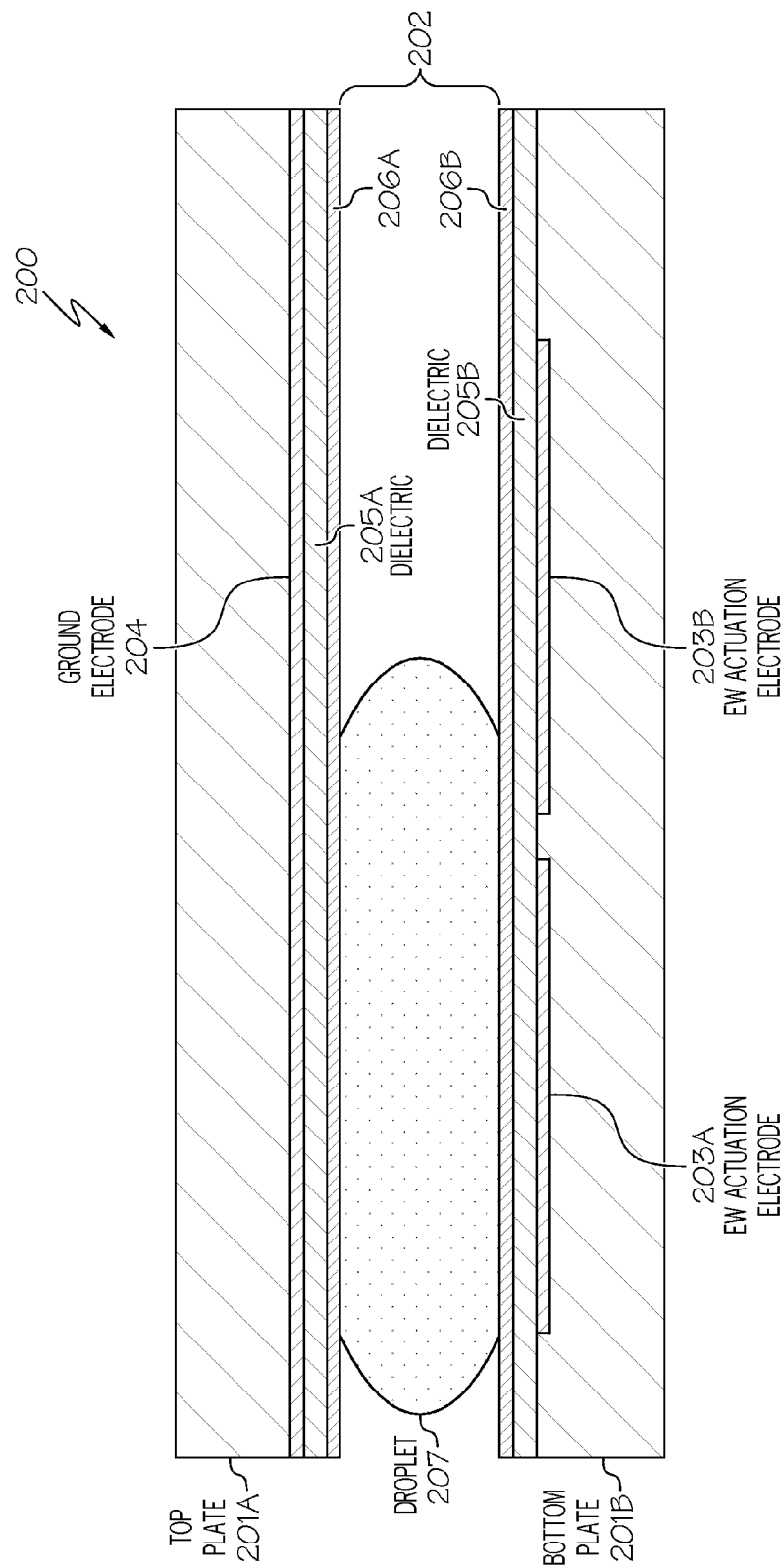
FIG. 2 illustrates the cross section of a device for electrowetting-based liquid pumping in accordance with an embodiment of the present invention.
Figure 3A:
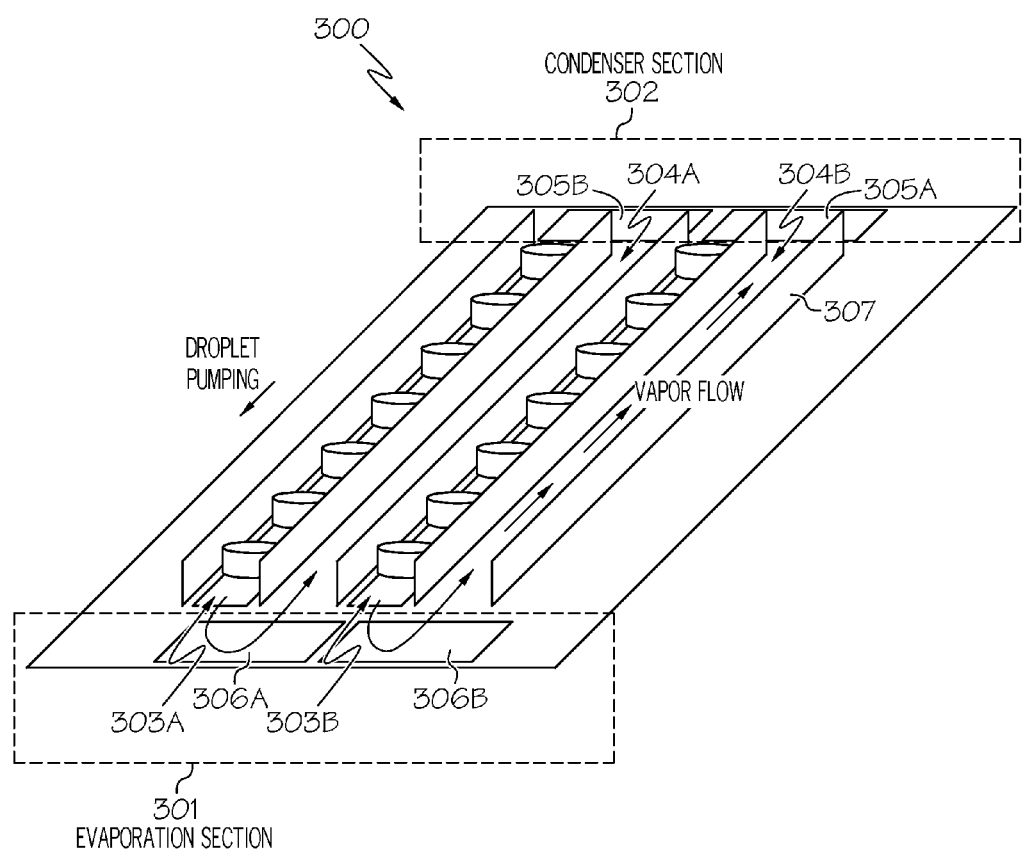
FIG. 3A illustrates an isometric view of an electrowetting heat pipe in accordance with an embodiment of the present invention.
Figure 3B:
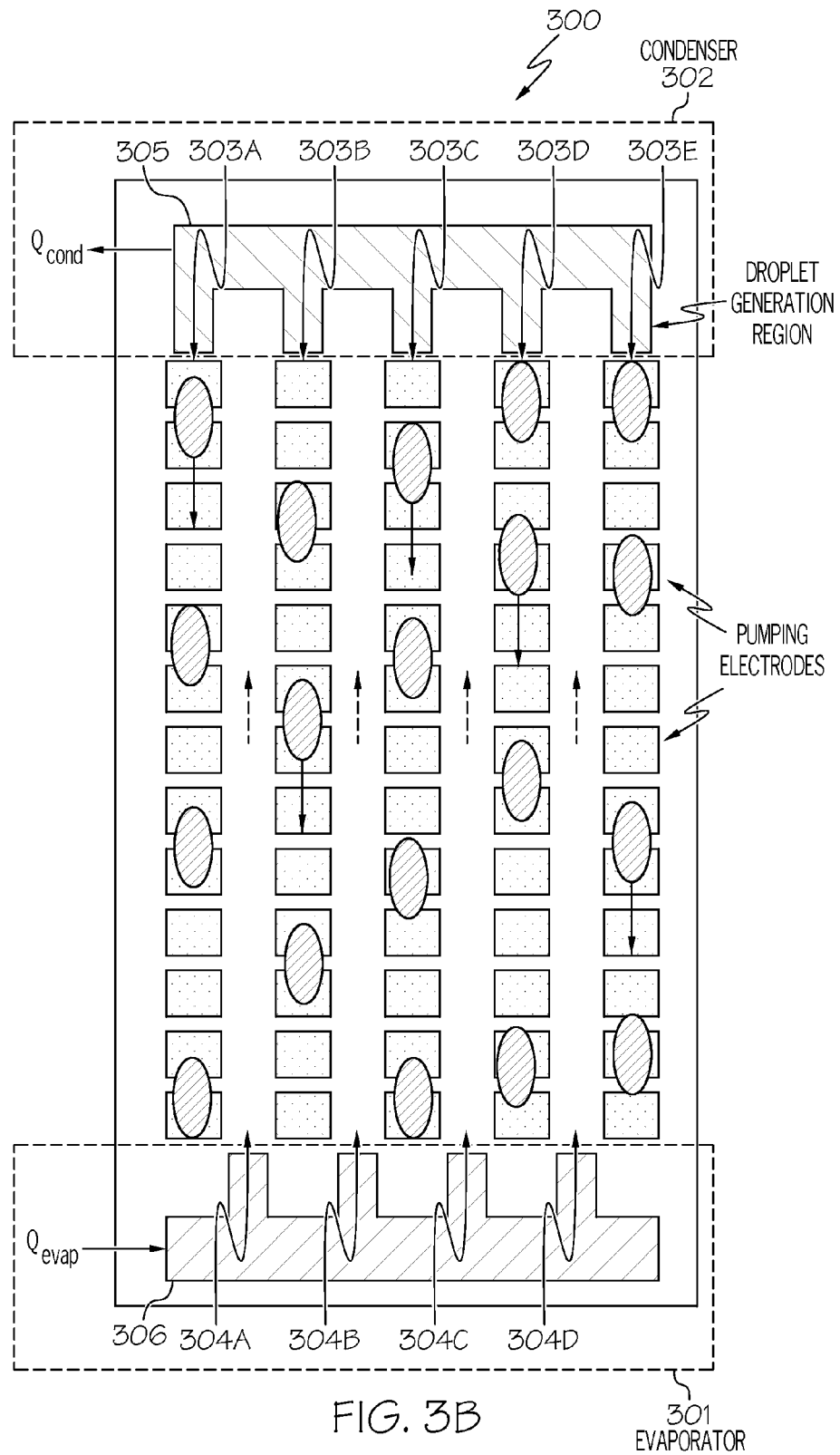
FIG. 3B illustrates a top view of the electrowetting heat pipe in accordance with an embodiment of the present invention.
Figure 4:
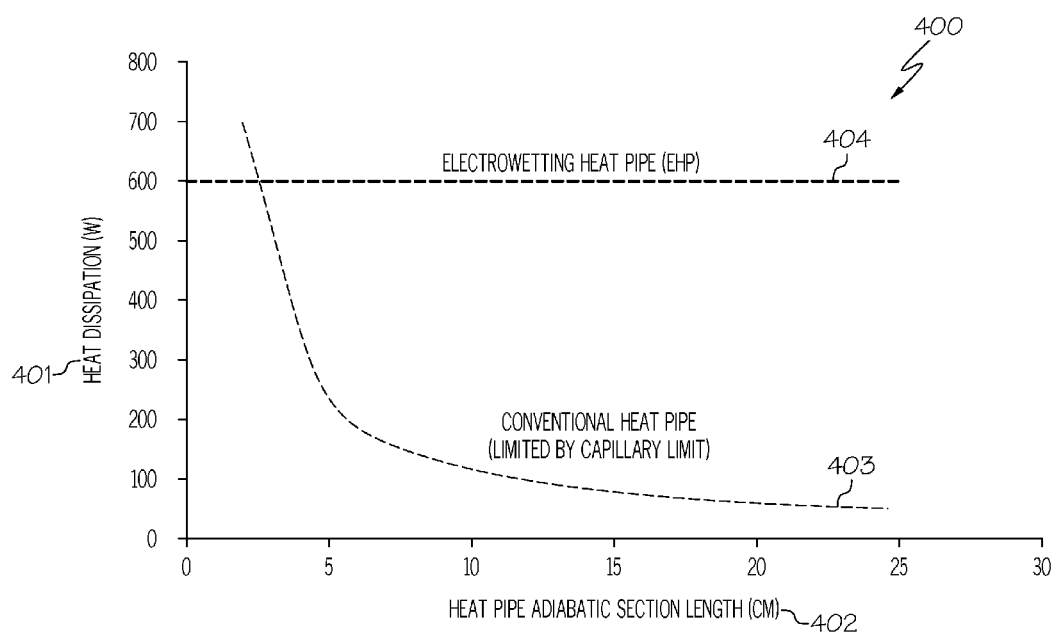
FIG. 4 is a graph of the heat dissipation capacity versus length for both conventional heat pipes and the electrowetting heat pipes of the present invention in accordance with an embodiment of the present invention.

The principles of the present invention provide a means for developing a longer and thinner heat pipe (e.g., more than six feet in length as well as less than 2 millimeters in thickness) than conventional heat pipes by transporting liquid (as droplets) using electrical pumping as opposed to the use of a wick as discussed below in connection with FIGS. 2, 3A-3B and 4. FIG. 2 illustrates the cross section of a device for electrowetting-based liquid pumping. FIG. 3A illustrates an isometric view of an electrowetting heat pipe. FIG. 3B illustrates a top view of the electrowetting heat pipe. FIG. 4 is a graph of the heat dissipation capacity versus length for both conventional heat pipes and the electrowetting heat pipes of the present invention.

As discussed above, conventional heat pipes can be made longer and thinner (e.g., more than six feet in length as well as less than 2 millimeters in thickness) than existing heat pipes via the use of transporting liquid (as droplets) by electrical pumping as opposed to the use of a wick structure. The device for achieving droplet motion using electrowetting is shown in FIG. 2.

Referring to FIG. 2, FIG. 2 illustrates the cross section of a device 200 for electrowetting-based liquid pumping in accordance with an embodiment of the present invention. Device 200 includes two flat plates 201A-201B separated by a fixed spacing 202, where a liquid droplet is transported. Plates 201A-201B may collectively or individually be referred to as plates 201 or plate 201, respectively. Control electrodes 203A-203B on lower plate 201B can be independently actuated. Control electrodes 203A-203B may collectively or individually be referred to as electrodes 203 or electrode 203, respectively. While FIG. 2 illustrates two electrodes, device 200 includes numerous electrodes 203, such as along an entire length of a channel (see discussion of liquid conduit 303 of electrowetting heat pipe 300 further below), where a series of the electrodes are selectively actuated so as to propel a liquid droplet along the length of the channel as discussed further below.

As illustrated in FIG. 2, upper plate 201A is covered by a single electrode 204 which is grounded. Both plates 201A-201B are covered by a dielectric layer 205A-205B, respectively, and a thin hydrophobic layer 206A-206B, respectively, to provide low friction.

Dielectric layers 205A-205B may collectively or individually be referred to as dielectric layers 205 or dielectric layer 205, respectively. In one embodiment, dielectric layer 205 can range in thickness from nanometers to microns depending on the application. Furthermore, dielectric layer 205 can be smooth or textured (rough). Additionally, the surface energy of dielectric layer 205 will be low which will make dielectric layer 205 superhydrophobic. In one embodiment, dielectric layer 205 is made of a single material. In one embodiment, dielectric layer 205 is composed of multiple materials. In one embodiment, dielectric layer 205 is multilayered. Furthermore, dielectric layer 205 may be a polymer, oxide, ceramic or another type of insulating material.

Furthermore, hydrophobic layers 206A-206B may collectively or individually be referred to as hydrophobic layers 205 or hydrophobic layer 205, respectively. While FIG. 2 illustrates the use of hydrophobic layers 206, the principles of the present invention are not to be limited in scope to the required use of hydrophobic layers 206. In one embodiment, hydrophobic layers 206 are superhydrophobic layers.

The size of a droplet 207 is chosen to be bigger than the electrode pitch (pitch of electrodes 203A-203B) so that it overlaps more than one electrode 203. When electrode 203B is energized, droplet 207 moves to the right and comes to equilibrium at the center of electrode 203B. By pulsing voltages along an array of discrete electrodes 203, it is possible to keep droplet 207 moving continuously.

The present invention combines the use of electrowetting-based pumping in a heat pipe architecture to arrive at what is referred to herein as the "electrowetting heat pipe" (EHP). FIG. 3A illustrates the isometric view of an electrowetting heat pipe 300 in accordance with an embodiment of the present invention. FIG. 3B illustrates a top view of electrowetting heat pipe 300 in accordance with an embodiment of the present invention.

Referring to FIGS. 3A-3B in conjunction with FIG. 2, electrowetting heat pipe 300 includes an evaporator region 301 and a condenser region 302 at the ends along with separate liquid conduits 303A-303E and vapor conduits 304A-304D for connecting evaporator region 301 with condenser region 302. Evaporator region 301 is designed to convert liquid drops into vapor; whereas, condenser region 302 is designed to condense vapor into liquid droplets. In one embodiment, evaporator region 301 is textured (roughened) and hydrophilic to promote liquid spreading and evaporation. In one embodiment, condenser region 302 is superhydrophobic and textured (roughened) to promote efficient condensation. Liquid conduits 303A-303E may collectively or individually be referred to as liquid conduits 303 or liquid conduit 303, respectively. Vapor conduits 304A-304D may collectively or individually be referred to as vapor conduits 304 or vapor conduit 304, respectively. While FIG. 3A illustrates two liquid conduits 303 and two vapor conduits 304 and FIG. 3B illustrates five liquid conduits 303 and four vapor conduits 304, electrowetting heat pipe 300 may include any number of liquid conduits 303 and vapor conduit 304. Liquid conduits 303 are designed to carry the liquid droplets; whereas, vapor conduits 304 are designed to carry the vapor.

The heat load in evaporator 301 is absorbed by liquid evaporation. The vapor is directed through the vapor-conduit channels 304 to the opposite end 302, where heat release occurs due to condensation. In one embodiment, the vapor and liquid flows occur in different channels (vapor flows in vapor conduits 304 and liquid flows in liquid conduits 303) to prevent entrainment of the liquid into the vapor stream which would reduce heat transfer efficiencies. At condenser 302, discrete liquid droplets are "electrically" pinched from the condensed pool (see sections 305A-305B) and pumped towards evaporator 301 in liquid conduits 303 by sequentially actuating a series of underlying electrodes, such as electrodes 203 shown in device 200 of FIG. 2. Sections 305A-305B may collectively or individually be referred to as sections 305 or section 305, respectively. While FIG. 3A illustrates two sections 305, electrowetting heat pipe 300 may include any number of sections 305 comprising the condensed pool. Furthermore, sections 305 may have one or multiple electrodes to create droplets from the liquid pool on condenser 302.

The liquid that may be transported herein via liquid conduits 303 may include water, organic solvents, liquid metals, etc. In one embodiment, the liquid flow in liquid conduits 303 is achieved by device 200 which forms liquid conduit channel 303. By implementing electrowetting for achieving droplet motion as opposed to the use of a wick structure, the length of a heat pipe may be increased (e.g., more than six feet in length), since the length restrictions due to fundamental wick limitations are no longer valid. Additionally, since the electrowetting force is greater than 10× the force of gravity, it is possible to transport fluid uphill over long distances, which has distinct advantages. Furthermore, by implementing electrowetting for achieving droplet motion as opposed to the use of a wick structure, the thickness of the heat pipe may be decreased (less than 2 millimeters in thickness) in comparison to conventional heat pipes. In one embodiment, electrowetting heat pipe 300 may be less than 2 millimeters in thickness by having 1.5 millimeter tall channels 303, 304 for droplet and vapor flow, respectively, and a 0.25 millimeter thick top and bottom plates 201A-201B, respectively.

At evaporator 301, the droplets are spread using electrowetting across sections 306A-306B, such as described above in connection with FIG. 2, to form a thin film which evaporates and continues the cycle. In one embodiment, the droplets are spread using electrowetting by having device 200 of FIG. 2 form sections 306A-306B. Sections 306A-306B may collectively or individually be referred to as sections 306 or section 306, respectively. While FIG. 3A illustrates two sections 306, electrowetting heat pipe 300 may include any number of sections 306 for electrowetting-based droplet spreading and evaporation. By using electrowetting-based spreading in evaporator 301, the evaporation area is increased and evaporation is enhanced.

In another embodiment of the present invention, liquid droplet pumping occurs on superhydrophobic textured surfaces or oil-infused textured surfaces of liquid conduits 303, which act as a lubricant and reduce the electrical voltage needed for liquid pumping. The electrical voltage may be a DC voltage (positive or negative) or an AC voltage. Furthermore, the electrical voltage may be any other complex electrical waveform. Additionally, the electrical voltage can be supplied to individual electrodes (e.g., electrode 203A) by a network of electrical bus bars and interconnects on the heat pipe bottom plate 201B.

In another embodiment of the present invention, electrowetting heat pipe 300 does not contain any walls 307 to separate the liquid and vapor conduit channels 303, 304, respectively, as illustrated in FIG. 3A. Liquid and vapor flows will form as discussed above using the electrowetting principles of the present invention but without any walls 307 to separate the liquid and vapor regions. In other words, droplets will flow in liquid conduits 303 towards evaporator 301 and vapor will flow in vapor conduits 304 towards condenser 302 as discussed above but without the existence of walls 307 to separate these liquid and vapor regions.

As discussed above, by replacing the wick structure of the conventional heat pipe with electrical pumping, the capillary limit becomes irrelevant. As a result, longer heat pipes can be developed. FIG. 4 is a graph 400 illustrating the heat dissipation capacity (Watts, W) 401 versus length (centimeters, cm) 402 for both conventional heat pipes (see dashed line 403) and the electrowetting heat pipes of the present invention (see dashed line 404) in accordance with an embodiment of the present invention.

Figure 1:
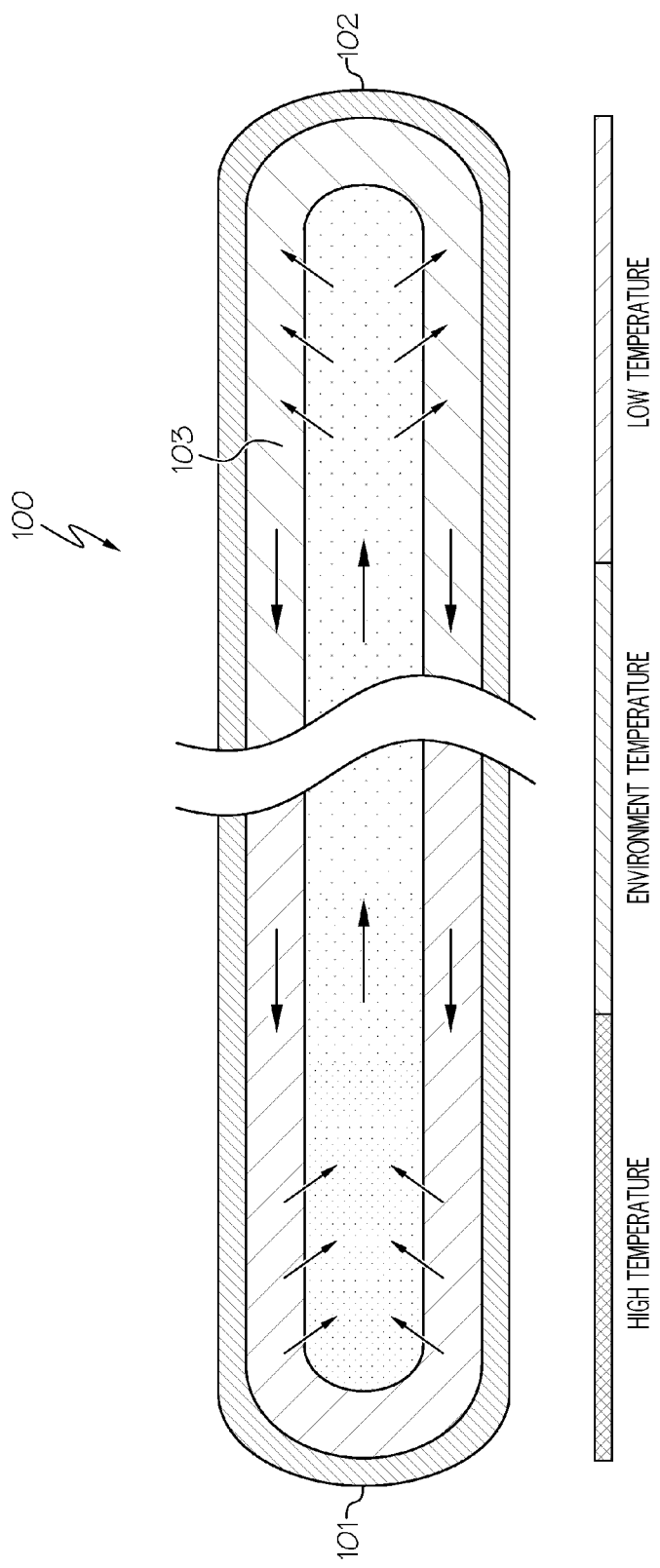
FIG. 1 illustrates the cross section of a conventional heat pipe.

Referring to FIG. 4, FIG. 4 illustrates that the heat dissipation capacity of conventional heat pipes decreases as the length increases (see dashed line 403). This sharp performance degradation is due to the limitation of the wick structure (see wick structure 103 of FIG. 1) in transporting heat over long distances. On the other hand, the EHP heat dissipation capacity (see dashed line 404) does not depend on the heat pipe length, but on the condenser and the evaporator performance. FIG. 4 shows that >10× heat dissipation capacity enhancement is possible for long heat pipes by utilizing the electrowetting-based pumping of the present invention to beat the capillary limit. Such a heat pipe may be packaged using existing packaging materials and processes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A heat pipe, comprising:
   a condenser region configured to condense vapor into liquid and split said liquid into droplets;
   a plurality of liquid conduits for carrying said liquid droplets, wherein each liquid conduit of said plurality of liquid conduits comprises a first plurality of underlying electrodes;
   a plurality of vapor conduits for carrying said vapor; and
   an evaporator region connected to said condenser region via said plurality of liquid conduits and vapor conduits, wherein said evaporator region is configured to evaporate said liquid droplets, wherein said evaporator region comprises active electrodes to spread said liquid droplets within said evaporator region and said active electrodes extend to at least partially intersect at least one vapor conduit of said plurality of vapor conduits;
   wherein said liquid droplets condensed by said condenser region are electrically pumped towards said evaporator region by sequentially actuating a series of said first plurality of underlying electrodes.

2. The heat pipe as recited in claim 1, wherein each liquid conduit of said plurality of liquid conduits comprises a top plate and a bottom plate separated by a fixed spacing where said liquid droplets are transported.

3. The heat pipe as recited in claim 2, wherein said top plate is covered by a grounded electrode, wherein said first plurality of underlying electrodes are located on said bottom plate.

4. The heat pipe as recited in claim 3, wherein said top and bottom plates are covered by a dielectric layer, wherein said dielectric layer is covered by a hydrophobic layer.

5. The heat pipe as recited in claim 4, wherein a size of a liquid droplet being transported along a liquid conduit overlaps more than one electrode of said first plurality of underlying electrodes.

6. The heat pipe as recited in claim 2, wherein said plurality of liquid conduits and vapor conduits are approximately 1.5 millimeters in height, wherein said top plate and said bottom plate are approximately 0.25 millimeters in thickness.

7. The heat pipe as recited in claim 1, wherein said liquid droplets comprise droplets of one of the following: water, organic solvents and liquid metals.

8. The heat pipe as recited in claim 1, wherein said evaporator region further comprises a second plurality of underlying electrodes configured to spread said liquid droplets to form a film which evaporates.

9. The heat pipe as recited in claim 1, wherein a surface of said plurality of liquid conduits comprises a superhydrophobic textured surface or an oil-infused textured surface.

10. The heat pipe as recited in claim 1, wherein each liquid conduit of said plurality of liquid conduits is separated from a vapor conduit by a wall.

* * * * *